US009065009B2

(12) United States Patent
Dauson et al.

(10) Patent No.: US 9,065,009 B2
(45) Date of Patent: Jun. 23, 2015

(54) APPARATUS AND METHOD FOR FORMING A TRANSPARENT CONDUCTIVE OXIDE LAYER OVER A SUBSTRATE USING A LASER

(71) Applicant: FIRST SOLAR, INC., Perrysburg, OH (US)

(72) Inventors: Douglas Dauson, Perrysburg, OH (US); Joseph Kucharczyk, Waterville, OH (US); James D. Reed, Findlay, OH (US); Thomas W. Shields, Perrysburg, OH (US)

(73) Assignee: FIRST SOLAR, INC., Perrysburg, OH (US)

( * ) Notice: Subject to any disclaimer, the term of this patent is extended or adjusted under 35 U.S.C. 154(b) by 99 days.

(21) Appl. No.: 13/859,137

(22) Filed: Apr. 9, 2013

(65) Prior Publication Data
US 2013/0267060 A1 Oct. 10, 2013

Related U.S. Application Data

(60) Provisional application No. 61/622,059, filed on Apr. 10, 2012.

(51) Int. Cl.
*H01L 21/00* (2006.01)
*H01L 31/18* (2006.01)
*H01L 31/0224* (2006.01)
*H01L 21/02* (2006.01)

(52) U.S. Cl.
CPC .... *H01L 31/1884* (2013.01); *H01L 31/022466* (2013.01); *H01L 21/02565* (2013.01); *H01L 21/02675* (2013.01); *Y02E 10/50* (2013.01)

(58) Field of Classification Search
None
See application file for complete search history.

(56) References Cited

U.S. PATENT DOCUMENTS

| 4,330,363 A | 5/1982 | Biegesen et al. |
| 4,464,557 A | 8/1984 | Risbud et al. |
| 5,683,935 A | 11/1997 | Miyamoto |
| 5,853,478 A | 12/1998 | Yonehara et al. |
| 6,890,840 B2 | 5/2005 | Isobe et al. |
| 7,540,921 B2 | 6/2009 | Matsumura et al. |
| 7,994,029 B2 | 8/2011 | Cheng et al. |
| 2008/0210945 A1 | 9/2008 | Miyairi |
| 2009/0272437 A1* | 11/2009 | Roberts et al. ............... 136/260 |
| 2010/0024865 A1 | 2/2010 | Shah et al. |
| 2010/0288355 A1 | 11/2010 | Mills et al. |
| 2011/0240117 A1* | 10/2011 | Yang et al. .................... 136/256 |
| 2012/0051376 A1 | 3/2012 | Baker et al. |
| 2012/0211755 A1* | 8/2012 | Fujimori et al. ............... 257/59 |

OTHER PUBLICATIONS

Higashi, et al.; *Pulsed-Laser-Induced Microcrystallization and Amorphization of Silicon Thin Films*, Jp. J. Appl. Phys. vol. 40 (1001) pp. 480-485.

* cited by examiner

*Primary Examiner* — Charles Garber
*Assistant Examiner* — Abdulfattah Mustapha
(74) *Attorney, Agent, or Firm* — Dickstein Shapiro LLP

(57) ABSTRACT

An apparatus and method for converting an amorphous transparent conductive oxide to a crystalline form with the assistance of irradiation of a laser.

11 Claims, 9 Drawing Sheets

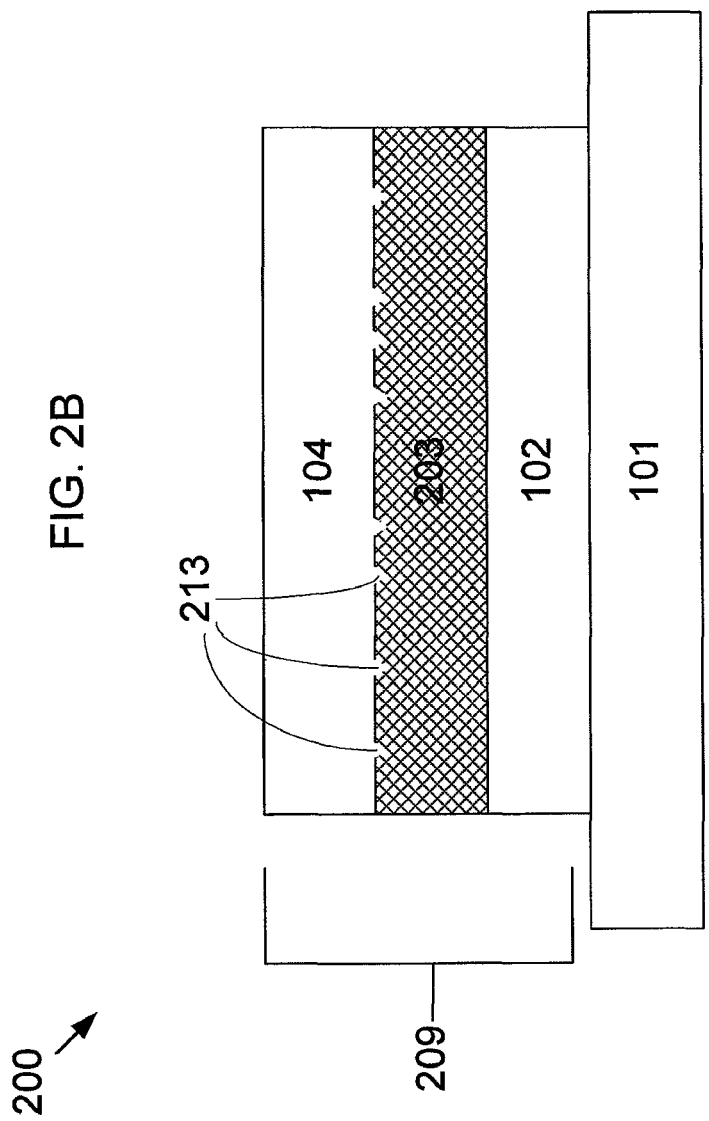

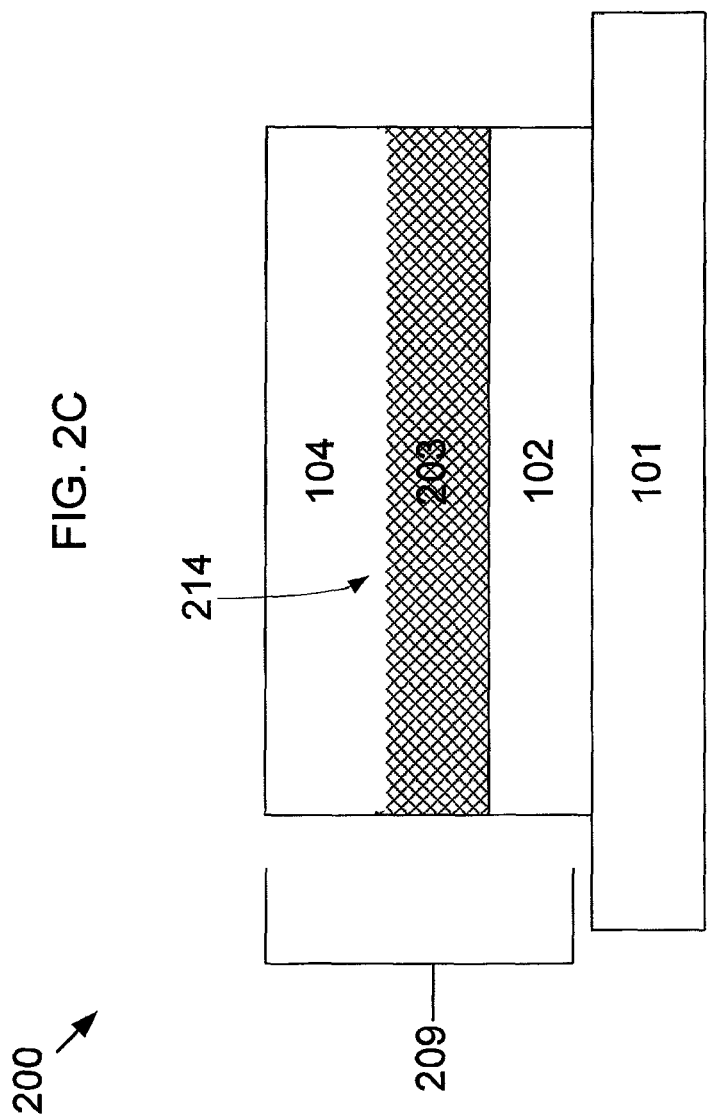

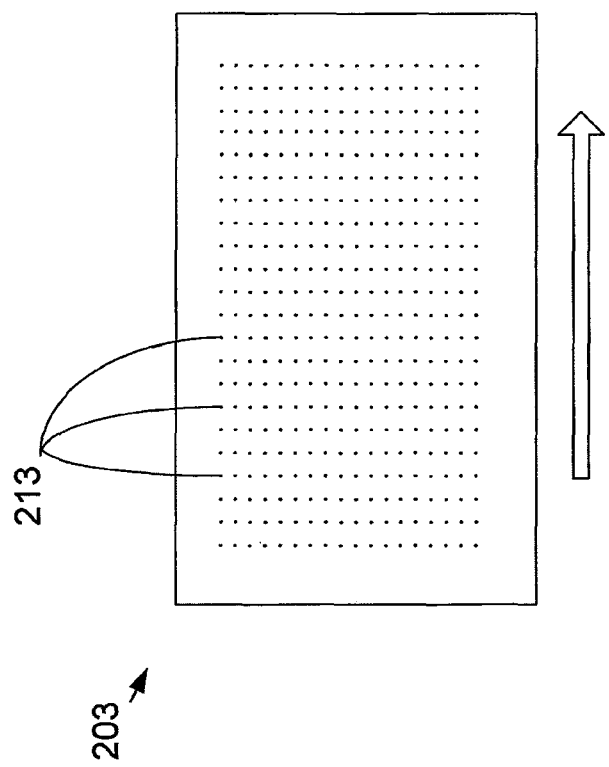

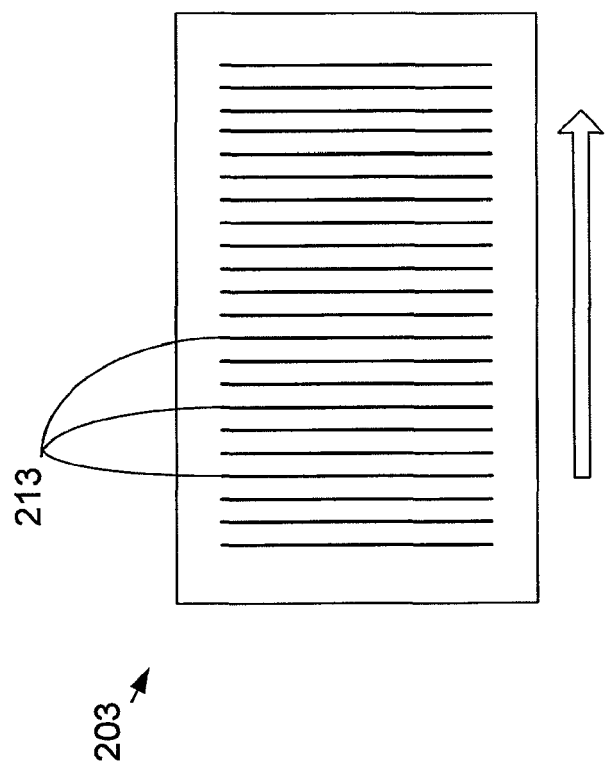

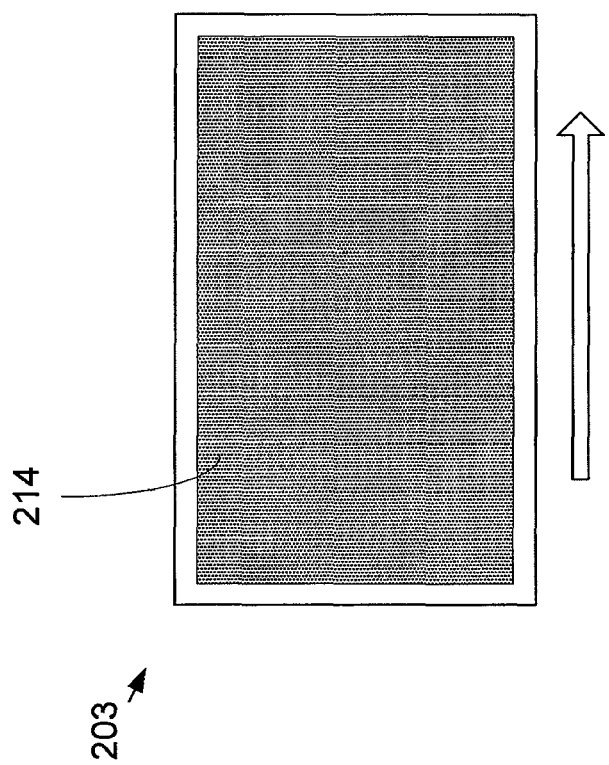

APPARATUS AND METHOD FOR FORMING A TRANSPARENT CONDUCTIVE OXIDE LAYER OVER A SUBSTRATE USING A LASER

CLAIM OF PRIORITY

This application claims priority under 35 U.S.C. §119(e) to U.S. Provisional Patent Application Ser. No. 61/622,059 filed on Apr. 10, 2012, which is hereby incorporated by reference in its entirety.

TECHNICAL FIELD

Disclosed embodiments relate generally to photovoltaic devices, which include photovoltaic cells and photovoltaic modules containing a plurality of photovoltaic cells, and more particularly, to an apparatus and method for forming a transparent conductive oxide layer over a substrate using a laser.

BACKGROUND

Photovoltaic devices can include semiconductor material deposited over a substrate such as glass, for example, with a first layer of the semiconductor material serving as a window layer and a second layer of the semiconductor material serving as an absorber layer. The semiconductor window layer forms a junction with the semiconductor absorber layer where incident light is converted to electricity.

Photovoltaic devices can also include a transparent conductive oxide (TCO) layer to conduct electrical charge. One TCO material which is often used is crystalline cadmium stannate. This is due to crystalline cadmium stannate's low sheet resistance (e.g., less than about 10 ohms/sq), and high light transmissivity (crystalline cadmium stannate only has a 3% average absorption of wavelengths in the solar spectrum).

Crystalline cadmium stannate TCO layers are often formed by first depositing an amorphous layer of cadmium and tin oxide over a substrate. The deposited amorphous layer is then transformed into crystalline cadmium stannate by being annealed at a high temperature (e.g., typically a temperature above about 550° C.) in a low oxygen partial pressure atmosphere (i.e., oxygen-deficient atmosphere) for a sufficient amount of (annealing) time (e.g., at least 10 minutes).

To provide the low oxygen partial pressure environment, current photovoltaic device manufacturing processes advocate forming the semiconductor window layer, which may be made of cadmium sulfide, on the amorphous TCO layer before it is annealed. Doing so deprives the amorphous layer of oxygen that may be available in an ambient processing atmosphere. In addition, the cadmium sulfide layer over the amorphous TCO layer encourages oxygen that may be present in the amorphous TCO layer to diffuse out of it. Specifically, the cadmium sulfide reacts with oxygen molecules in the amorphous layer to form cadmium oxide and sulfur dioxide. Under the annealing temperature, the formed cadmium oxide evaporates and along with the formed sulfur dioxide diffuses into the deposition ambient. So, the oxygen molecules that have been pulled out of the amorphous layer get to diffuse into the processing environment.

Further, the oxygen molecules that have been pulled out of the amorphous TCO layer produce oxygen vacancies in the layer. Each oxygen vacancy acts as an electron donor which, once the amorphous TCO layer is transformed to a crystalline form, helps with electrical conductivity. Thus, the window layer is used as a reducing agent since it creates the needed oxygen-deficient atmosphere that promotes the oxygen vacancies in the TCO layer.

However, using high temperatures for long periods of time can damage glass substrates. For example, glass substrates will often begin to soften at or near a soda-lime glass transition temperature ($T_g$) of about 573° C. (i.e., above about 550° C.). Thus, subjecting the glass substrates to such a high annealing temperature (i.e., above about 550° C.) for such a relatively long time (i.e., 10 minutes or more), increases the risk of damaging the substrates. Specifically, the glass substrates may begin to soften and warp at the high annealing temperatures applied for such long annealing periods of time.

Further, the high annealing temperature has a tendency to ionize sodium atoms or molecules present in the glass substrates, which over time may diffuse to other layers of the devices. Diffusion of sodium ions in certain layers of the devices may adversely affect device performance.

In addition, a long annealing time decreases productivity and also subjects the annealing chamber to conditions favorable to chamber degradation, which can require remediation.

Last but not least, the high annealing temperature used to transform the amorphous layer into crystalline is one of many high temperatures to which the devices may be subjected while being processed. For example, other layers may have to be annealed at high temperatures. Thus, the devices may be subjected to high thermal cycles. These thermal cycles may weaken the glass and subject it to a high degree of breakage.

Accordingly, an apparatus and method to facilitate conversion of the amorphous TCO layer to a crystalline form which mitigates the effect of the above-mentioned problems is desirable.

DESCRIPTION OF DRAWINGS

FIG. 2B is a cross-sectional view of the photovoltaic device of FIG. 2A at a stage of processing subsequent to that of FIG. 2A following a laser irradiation process according to a disclosed embodiment.

FIG. 2C is a cross-sectional view of the photovoltaic device of FIG. 2A at a stage of processing subsequent to that of FIG. 2A following a laser irradiation process according to a disclosed embodiment.

FIG. 2D is a top-down view of the TCO stack of the photovoltaic device of FIG. 2B according to a disclosed embodiment.

FIG. 2E is a top-down view of the TCO stack of the photovoltaic device of FIG. 2B according to a disclosed embodiment.

FIG. 2F is a top-down view of the TCO stack of the photovoltaic device of FIG. 2C according to a disclosed embodiment.

DETAILED DESCRIPTION

In the following detailed description, reference is made to the accompanying drawings which form a part hereof, and in which is shown by way of illustration specific embodiments that may be practiced. These embodiments are described in sufficient detail to enable those skilled in the art to make and use them, and it is to be understood that structural, logical, or procedural changes may be made to the specific embodiments disclosed without departing from the spirit and scope of the invention.

Embodiments described herein provide an apparatus for and a method of forming a crystalline cadmium stannate TCO layer by irradiating parts of an amorphous cadmium and tin oxide TCO layer with a laser to form nucleation sites. The nucleation sites, which are discrete locations in the amorphous TCO layer where chemical or physical change to crystalline has started to occur, are used to cultivate crystal growth in the layer. Specifically, at the nucleation sites, molecules in the amorphous TCO layer begin to arrange themselves into a crystal lattice by forming a regular pattern and cause adjacent molecules (e.g., the ones that are not at the nucleation sites) to react and bond to the lattice. Thus, the nucleation sites facilitate faster crystal growth within the amorphous TCO layer allowing for lower temperatures to be used when annealing the amorphous TCO layer into a crystalline form. Further, incidence of mottling in the crystalline TCO layer is greatly reduced since a reduced thermal load (i.e., lower annealing temperature and/or time) is more likely to result in a complete conversion of the amorphous layer into a crystalline layer. Mottling occurs when the amorphous layer has not totally been transformed into a crystalline form after being annealed.

Annealing temperatures used in instances where parts of the amorphous layer are irradiated to form nucleation sites are generally below the 573° C. $T_g$ (e.g., below about 550° C.). Alternatively, or in addition to the lower temperatures, shorter periods of annealing time (e.g., less than about 10 minutes) may be used. The lower annealing temperatures and/or periods of time lower the risk of substrate damage.

Figure 1:
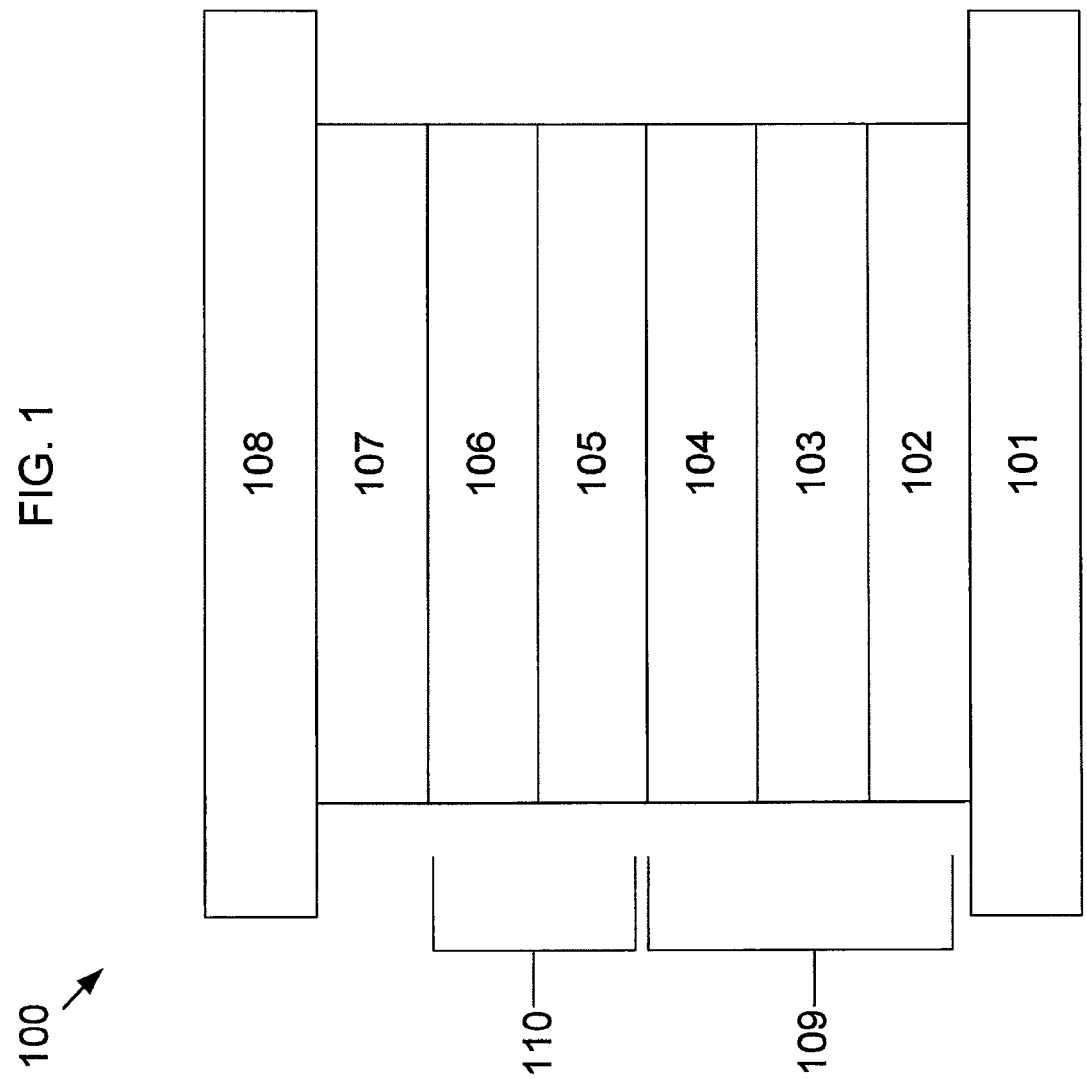
FIG. 1 is a cross-sectional view of a conventional photovoltaic device.

Referring to FIG. 1, an example of a conventional photovoltaic device 100 is shown. The conventional photovoltaic device 100 has a substrate 101 upon which a barrier layer 102, a TCO layer 103, a buffer layer 104, a semiconductor layer 110, a metal contact 107, and a back support 108 are respectively deposited. Barrier layer 102, TCO layer 103 and buffer layer 104 are often referred to as a TCO stack 109 since they can be formed first and deposited as a stack on the substrate 101. As will be explained later, buffer layer 104 may optionally be omitted from the TCO stack 109.

Substrate 101 and back support 108 protect the plurality of layers of device 100 from moisture intrusion, physical damage, and environmental hazards. Substrate 101 may be composed of a material that is durable and highly transparent, such as, for example, borosilicate glass, soda lime glass, or float glass. Back support 108 can be composed of any suitable protective material, and is typically formed of a substrate such as borosilicate glass, float glass, soda lime glass, carbon fiber, or polycarbonate. In this particular example, soda lime glass is used for both the substrate 101 and the back support 108.

The barrier layer 102 is positioned between the substrate 101 and the TCO layer 103 to lessen diffusion of sodium or other contaminants from the substrate 101 to the semiconductor layer 110. Generally, when the substrate 101 begins to soften under heat, sodium atoms or molecules from the substrate 101 may get ionized and the resulting sodium ions may diffuse into different layers of the photovoltaic device 101. As mentioned before, diffusion of sodium ions in certain layers of the devices may adversely affect device performance. Thus, the barrier layer 102 is used to lower the likelihood of sodium ions diffusing into those layers. The barrier layer 102 may include, for example, silicon dioxide, silicon nitride, aluminum-doped silicon oxide, boron-doped silicon nitride, phosphorus-doped silicon nitride, silicon oxide-nitride, or any combination or alloy thereof.

The TCO layer 103, which serves as an electrical contact for the device 100, may include any suitable TCO material, including, for example, cadmium stannate or a cadmium tin oxide.

The buffer layer 104 is positioned between TCO layer 103 and semiconductor layer 110 to decrease irregularities occurring during the formation of the semiconductor layer 110. Specifically, due to certain processes used to create the TCO layer 103, the TCO layer 103 may have a rough surface. A TCO layer with a rough surface can increase the risk of discontinuity in a semiconductor window layer deposited thereon. Thus, whenever a TCO layer 103 with a rough surface is used, a buffer layer 104 may be used to smooth out the TCO layer 103 surface roughness. The buffer layer 104 may include various suitable materials, including, for example, tin oxide (e.g., tin (IV) oxide), zinc tin oxide, zinc oxide or zinc magnesium oxide.

The semiconductor layer 110 can be deposited on TCO stack 109 in a bi-layer form. The bi-layer may include an absorber layer 106 and a window layer 105. As mentioned above, the semiconductor window layer 105 forms a junction with the semiconductor absorber layer 106 where incident light is converted to electricity. The absorber layer 106 may be made of cadmium telluride whereas the window layer may be made of cadmium sulfide. Note that the absorber layer 106 may alternatively be made of copper indium diselenide, copper indium disulfide, copper indium aluminum diselenide, copper-indium-gallium-selenium (CIGS) semiconductor, or other semiconductor materials.

Metal contact 107 and TCO layer 103 are used as electrical contacts for photovoltaic device 100 through which the generated electrical power may be provided to external devices. Metal contact 107 may be one or more highly conductive materials, for example, molybdenum, aluminum, copper, silver, gold, or any combination thereof, providing a low-resistance ohmic contact.

Each layer in photovoltaic device 100 may, in turn, include more than one layer or film. Additionally, each layer can cover all or a portion of the photovoltaic device 100 and/or all or a portion of the layer or substrate underlying the layer. For example, a "layer" can include any amount of any material that contacts all or a portion of a surface. If a layer is formed "over" another layer, those layers are not required to be in contact.

Figure 2A:
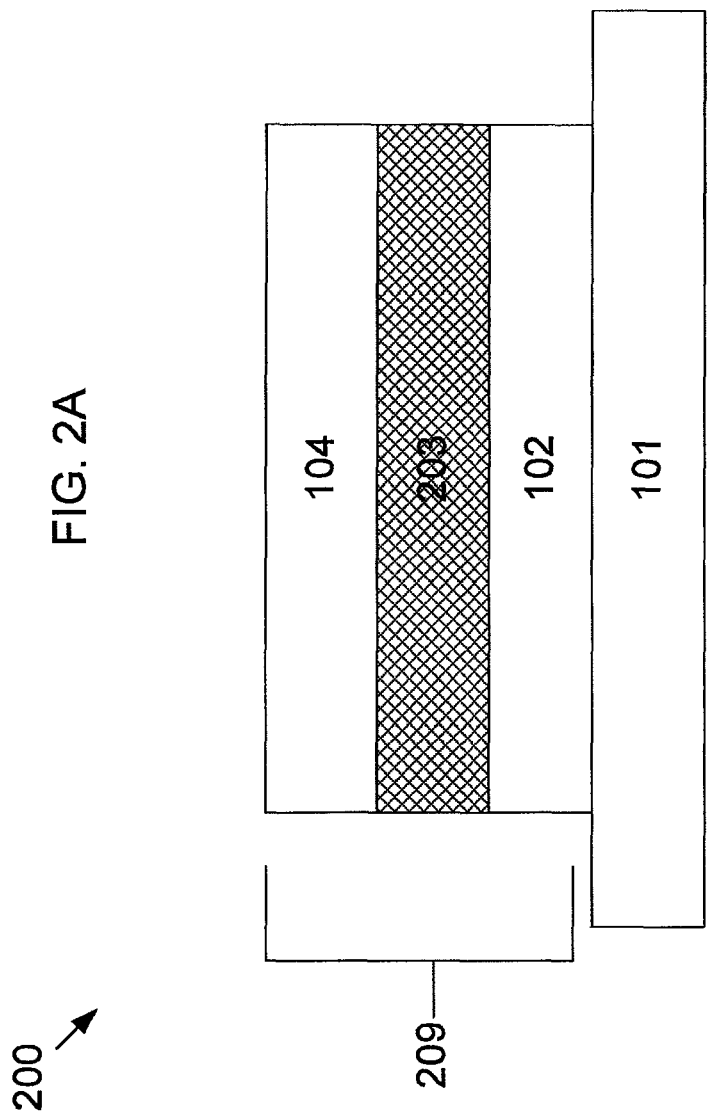
FIG. 2A is a cross-sectional view of an unfinished photovoltaic device at a stage of processing following formation of a TCO stack including an amorphous TCO layer.

FIG. 2A illustrates a cross-sectional view of a photovoltaic device 200. The photovoltaic device 200 includes an amorphous TCO layer 203 within a TCO stack 209. As noted above, the amorphous TCO layer 203 may be made of a combination of cadmium and tin oxide. Although in this particular example the amorphous layer is made of cadmium and tin oxide, it is not thus restricted. The amorphous TCO layer 203 may be made of any material containing at least one of cadmium and tin, or a material containing cadmium and tin with any ratio of cadmium to tin suitable for the resulting crystalline TCO layer. For example, the cadmium-to-tin atomic ratio can be about 2:1. Thus, the use of cadmium and tin oxide is for illustrative purposes only.

The amorphous TCO layer 203 can be of any suitable thickness, for example, between about 10 nm and 1000 nm. This thickness is dependent on a desired thickness of the resulting crystalline TCO layer. The amorphous TCO layer 203 may have any suitable sheet resistance and average optical absorption to form a crystalline layer with a low sheet resistance and high light transmissivity, as described above.

Such properties are needed for the resulting crystalline layer to function as an electrical contact while allowing light to pass through to the semiconductor layers. The amorphous TCO layer 203 can be deposited using any suitable technique, such as, for example, sputtering, which can occur within one or more zones of a sputtering coater apparatus 400, described below with respect to FIG. 3.

FIG. 2B and FIG. 2C respectively illustrate the photovoltaic device 200 of FIG. 2A after parts of the amorphous TCO layer 203 have been subjected to laser irradiation. As shown in FIG. 2B, there is a nucleation site 213 at each irradiated location in the amorphous TCO layer 203. FIG. 2C, on the other hand, shows a nucleation layer 214 formed from continuous laser irradiation of the amorphous TCO layer 203, described below.

Figure 3:
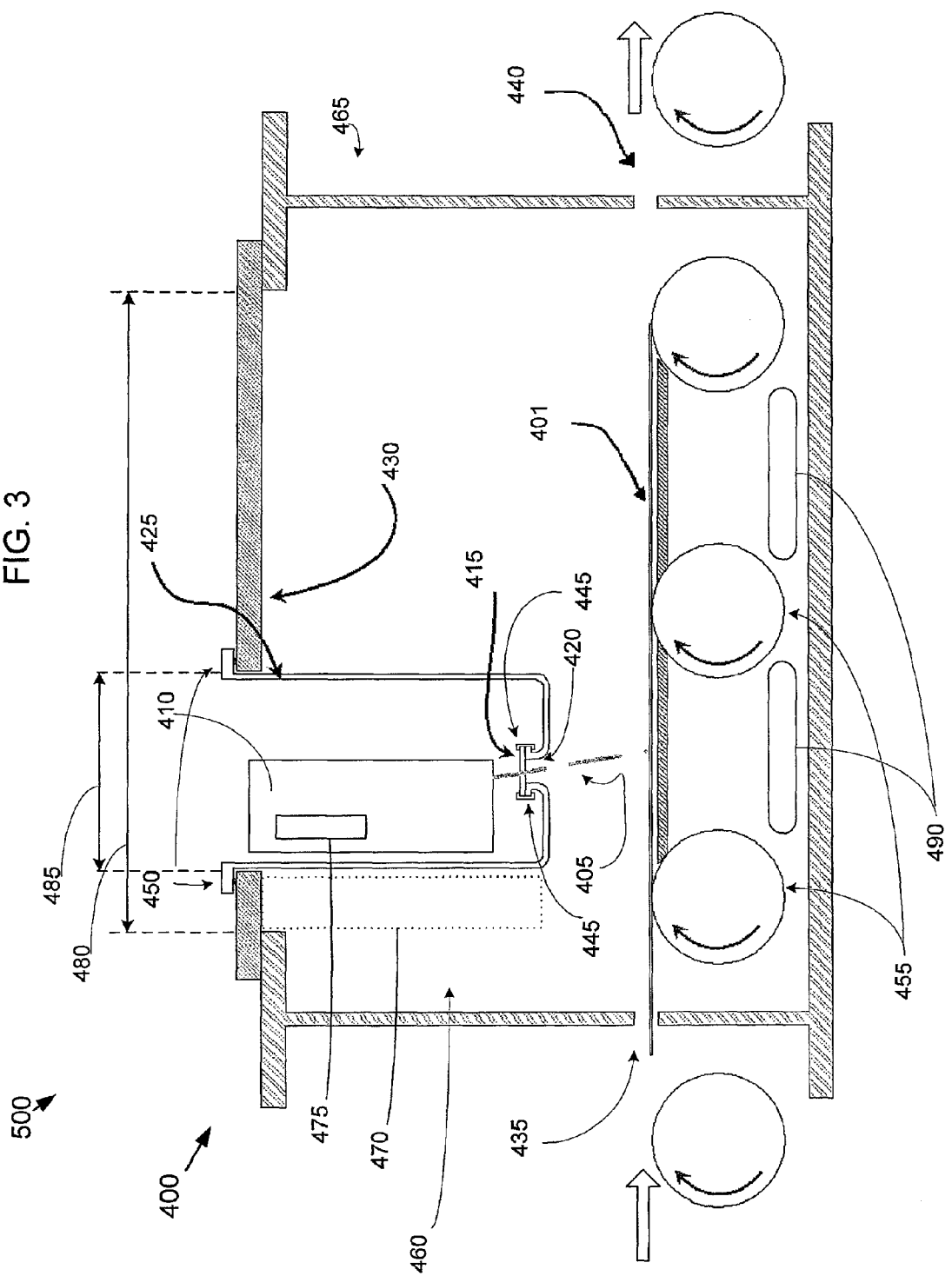
FIG. 3 is a schematic view of a coating system according to a disclosed embodiment.

FIG. 3 illustrates a coating system 500 and a sputtering coater apparatus 400 capable of irradiating at least parts of an amorphous TCO layer according to a disclosed embodiment. Generally, the irradiation of the amorphous TCO layer 203 may occur before or after the buffer layer 104 has been formed over the amorphous TCO layer 203. Obviously, when the irradiation of the amorphous TCO layer 203 occurs before the formation of the buffer layer 104, then the buffer layer 104 is deposited atop a nucleation-site-filled amorphous TCO layer 203. In such cases, there is a high likelihood of nucleation site disruption. To eliminate this likelihood, the buffer layer 104 may be formed before the irradiation of the amorphous TCO layer 203. Thus in this particular embodiment, the buffer layer 104 is formed over the amorphous TCO layer 203 before its irradiation. Consequently, the irradiation of the amorphous TCO layer 203 occurs through the buffer layer 104. However, irradiating the amorphous TCO layer 203 through the buffer layer 104 has its problems. For example, there is a potential for parts of the buffer layer 104 to be ablated away. For this reason, a laser 410 of moderate power should be used. A moderate laser power (e.g., about 10 W) obviously outputs less energy through the buffer layer 104 making it less likely to ablate (e.g., melt, evaporate) away.

Referring to FIG. 3, the laser 410 in sputtering coater apparatus 400 of coating system 500 generates a laser beam 405 to irradiate at least a portion of the amorphous TCO layer 203. The coating system 500 includes a transporting conveyor system 455, for example, a roller conveyor, for transporting a coated substrate 401 into the sputtering coater apparatus 400 through an entry opening 435 and out through an exit opening 440. The coated substrate 401 may include substrate 101 and TCO stack 209, or TCO stack 209 may be formed (sputtered) by dotted sputtering apparatus 470, illustrated in FIG. 3 with dotted lines. The sputtering coater apparatus 400 has at least one chamber 465 having a first opening 480 in a top surface. The at least one chamber 465 has at least one zone 460 in which a sputtering and laser irradiation process can be performed. The laser beam may be provided with the at least one chamber 465. Sputtering by sputtering apparatus 470 can occur before zone 460 or within zone 460. The sputtering coater apparatus 400 includes a cover 430 which extends over at least the entirety of the first opening 480. The cover 430 has a second opening 485. A housing 425, at least a portion of which is positioned inside the second opening 485, extends downward inside the sputtering coater apparatus 400 toward the coated substrate 401. The housing 425 may be substantially U-shaped from a cross-sectional perspective, as shown in FIG. 3. The housing 425 is supported by anchor portions 450 of the housing 425 which extend over respective opposing top surface portions of the cover 430 adjacent to the second opening 485.

Continuing with reference to FIG. 3, the laser 410 is positioned inside at least a portion of the housing 425. Alternatively, the laser 410 can be positioned inside the chamber 465. A bottom surface of the housing 425 proximate to the coated substrate 401 forms an inlet 420 extending upward toward the laser 410 which terminates at one or more windows 415 through which laser beam 405 passes prior to contacting the coated substrate 401. Brackets 445 respectively extend over and sandwich an end of the one or more windows 415 and a corresponding end of the inlet 420 in the bottom surface of the housing 425 which is closed by the one or more windows 415. Brackets 445 can be substantially C-shaped, for example.

The laser 410 is any suitable laser which can be configured to direct the beam 405 having a wavelength from about 300 nm to about 600 nm, or about 532 nm, toward the coated substrate 401. The beam 405 irradiates the amorphous TCO layer 203 to form one or more nucleation sites 213 (see FIG. 2B) or a nucleation layer 214 (see FIG. 2C). Therefore, the laser beam 405 can be continuous or discontinuous. Laser beam 405 can have any suitable laser power, for example, about 10 W, or other suitable power to ensure that buffer layer 104 does not ablate away. If buffer layer 104 is omitted, a laser having a power of greater than about 10 W may be employed. The laser 410 can include a diode pumped solid state laser. The laser 410 can include a laser or laser system described in co-pending U.S. patent application Ser. No. 13/220,075, entitled "System And Method For Laser Modulation," or in U.S. patent application Ser. No. 12/887,161, entitled "System And Method For Removing Coating From An Edge Of A Substrate," the disclosures of which are incorporated herein by reference in their entirety. Additionally, laser beam 405 can have any suitable pulsing frequency, which can allow it to be emitted in pulses rather than continuously. Laser beam 405 can be directed toward the coated substrate 401 along an optical path through the one or more windows 415, which can focus, expand, collimate, direct, redirect, reflect, filter, or otherwise transform laser beam 405 in any suitable manner. In addition to the one or more windows 415, the optical path may also include one or more lenses or mirrors of any suitable combination and configuration to direct laser beam 405 to the coated substrate 401.

Laser 410 can further include a current source 475 for supplying current thereto. Laser 410 can include a laser beam modulator to modulate the laser beam 405, for example, to hold laser power substantially constant, or change an average laser power, to prevent damage to the coated substrate 401. Laser beam modulator can modulate the laser beam 405, for example, by controlling the current source 475. The degree of modulation required can be based on any suitable variable, for example, an area of laser beam spots to be scanned on a top surface of coated substrate 401. Before the laser beam 405 is directed or redirected to a new position for creation of the nucleation sites 213, laser output modulator can modulate the laser beam 405 as appropriate based on the coordinates of the next nucleation site 213.

The laser beam 405 may continuously or intermittently irradiate the coated substrate 401. As shown in FIGS. 2D, 2E and 2F, the laser beam 405 directed from laser 410 in sputtering coater apparatus 400 irradiates the coated substrate 401 in a laser irradiation pattern that is substantially perpendicular to the movement of the coated substrate 401 through the apparatus 400 and past the laser 410. The laser irradiation pattern can include a linear arrangement of spots (or islands) (FIG. 2D), an arrangement of lines (FIG. 2E), a continuous nucleation layer (FIG. 2F), or other suitable arrangement to form nucleation sites within the amorphous TCO layer 203.

Obviously, the larger the surface area of the coated substrate 401 to be processed, the longer the laser irradiation process lasts. The duration also depends on the number, density and pattern of nucleation sites. For example, for a coated substrate measuring about 24 inches by about 48 inches, the laser irradiation process is performed for a period of about 45 seconds or less, in which time the laser pattern of FIGS. 2D, 2E or 2F, for example, is completed. For substrates having a greater surface area, the laser irradiation process is conducted for a period of about 60 seconds or less. The laser irradiation process may or may not occur in an oxygen-deficient atmosphere.

Figure 2G:
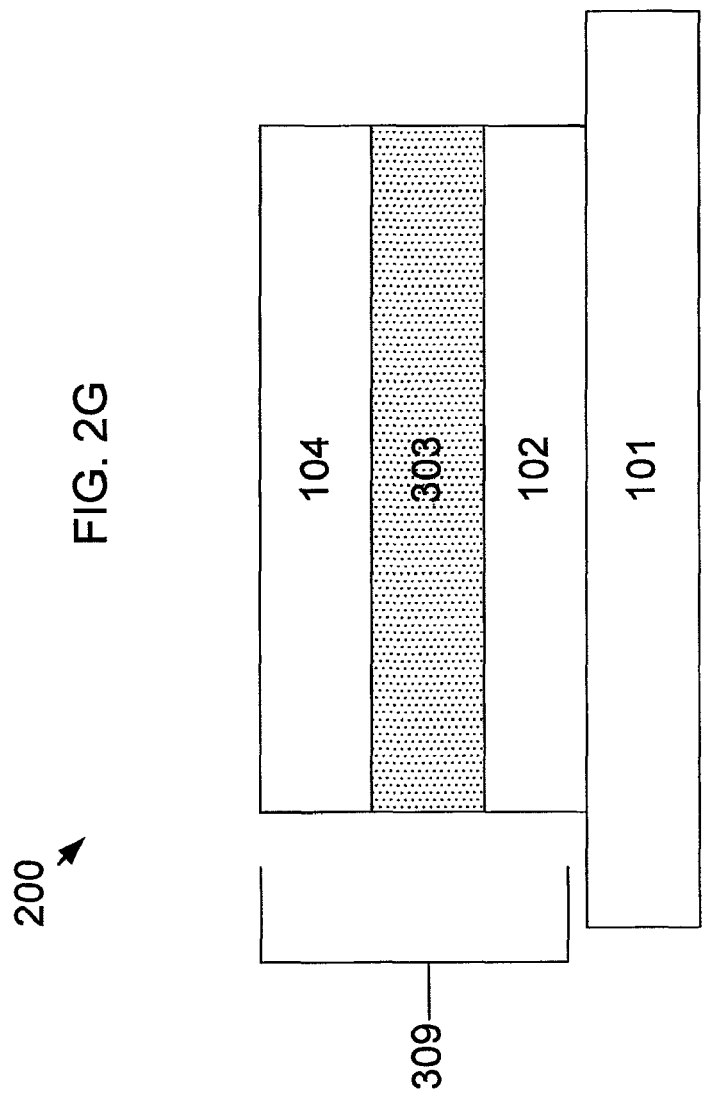
FIG. 2G is a cross-sectional view of the photovoltaic device of FIG. 2B at a stage of processing subsequent to that of FIG. 2B following an annealing process.

The amorphous TCO layer 203 in FIG. 2B or FIG. 2C can undergo any suitable annealing process to finish converting to a crystalline form, for example, to form a crystalline TCO layer 303 (FIG. 2G). For instance, annealing could occur after laser irradiation in the sputtering coater apparatus 400. The sputtering coater apparatus 400 may include one or more heaters 490 to bring the temperature up to as well as to maintain a desired processing temperature (e.g., a temperature between 400° C. and 750° C.). The heating provided by the one or more heaters 490 can provide radiated heating, convective heating, and/or resistive heating. A forming gas (e.g., a mixture of hydrogen and an inert gas such as nitrogen, argon or helium) may be sourced into the sputtering coater apparatus 400 to provide an oxygen-deficient environment. This annealing process would transform the amorphous TCO layer 203 into crystalline TCO layer 303 at a reduced temperature and/or time than in the current manufacturing process flow due to the nucleation sites formed by the laser irradiation process.

Alternatively, an annealing process can begin after formation of the window layer 105 (described below) in a vapor transport deposition apparatus or other semiconductor deposition apparatus at a temperature of about 400° C. to about 750° C., depending on the annealing time. As described above, the window layer 105 provides the oxygen-deficient atmosphere needed for amorphous TCO layer 203 conversion. Amorphous TCO layer 203 annealing after laser irradiation or after window layer 105 deposition eliminates the need for a separate annealing process. Alternatively, a stand-alone annealing oven known in the art may be used but this introduces an additional processing step which increases manufacturing cost and time. Amorphous TCO layer annealing processes are described in co-pending Provisional App. Ser. No. 61/606,512, incorporated herein by reference. Regardless of which annealing process is used, as discussed above, transformation can continue until after absorber layer 106 deposition (FIG. 1), if portions of the TCO layer 303 (FIG. 2G) remain in an amorphous form. For example, this can be observed by capturing cross-section scanning electron microscope (SEM) images of the coated substrate that show the degree of mottling in the TCO layer at various stages of processing.

The laser irradiation process according to the disclosed embodiments reduces the intensity and duration of the annealing process proportionally to the amount of crystal growth initiated by nucleation sites 213 or layer 214 formed to facilitate more rapid crystal formation before and during the subsequent TCO stack 209 annealing process. The nucleation sites lower the activation energy required for TCO crystallization, which allows for annealing at a lower temperature and/or for a shorter time. For example, annealing temperatures can be lowered from current parameters of at least about 550° C. and up to about 750° C. for as long as about 25 minutes, or from about 15 minutes to about 20 minutes, to a range of about 400° C. to about 750° C., for about 3 minutes to about 20 minutes, depending on the temperature used. As examples, annealing can occur at between about 400° C. and about 550° C. for between 10 minutes and 20 minutes, and at between about 550° C. and about 750° C. for less than 10 minutes. Such a lower annealing temperature and/or shorter heat exposure time prevents substrate warping and other substrate damage which can occur at annealing temperatures above about 550° C. for a time of as long as 25 minutes.

In addition, a shorter annealing time increases the throughput of the sputtering coater apparatus 400. Lower annealing temperatures may also help control substrate 101 flatness, otherwise known as edge kink. Substrate softening that stems from an increased thermal load may cause edge kink. The degree of substrate flatness, which can be measured by any method known in the art, is based on the deviation of a top surface of the coated substrate 401 relative to a reference plane. According to the disclosed embodiments, substrate flatness can be controlled by converting the amorphous TCO layer at a reduced temperature and/or time to measure less than 150 microns. Without amorphous TCO layer laser irradiation, substrate flatness can be greater than 150 microns, or between 150 microns and 200 microns. This edge kink or decreased substrate flatness could make devices spatially incompatible with current device packaging and/or installation techniques. Employing the laser irradiation process can also help form a crystalline TCO stack 309 (FIG. 2G) with a low sheet resistance, for example, less than about 10 ohms/sq, or about 6 ohms/sq. This is because the nucleation sites formed prior to annealing increase the likelihood of a complete conversion to a crystalline form. By having been completely converted to a crystalline form, the crystalline TCO stack 309 will allow electric current to pass through it much more easily and thus improve its electrical contact function.

The coated substrate 401 can be introduced into a further coating apparatus where subsequent semiconductor layers, for example, a cadmium sulfide window layer 105 and a cadmium telluride absorber layer 106 in FIG. 1, may be formed. The further coating apparatus can be a vapor transport deposition (VTD) (generally where semiconductor material is evaporated, carried by an inert gas and deposited on a substrate) apparatus or close-space sublimation (CSS) (generally where a deposition source disposed a close distance from a substrate evaporates and deposits on the substrate) apparatus, such as a multiple-zone oven, or any other deposition apparatus known in the art. The further coating apparatus for applying the semiconductor layers 105, 106 can be of any suitable size and/or capacity. The oven can be configured to process panels successively and continuously in line through a conveyor mechanism. The oven can also be configured to use various suitable methods of material deposition or heating. Following deposition of the semiconductor layers 105, 106, the metal contact 107 and back support 108, shown in FIG. 1, are applied.

Details of one or more embodiments are set forth in the accompanying drawings and description. Other features, objects, and advantages will be apparent from the description, drawings, and claims. Although a number of embodiments have been described, it will be understood that various modifications may be made without departing from the spirit and scope of the invention. It should also be understood that the appended drawings are not necessarily to scale, presenting a somewhat simplified representation of various features and basic principles of the invention.

What is claimed is:

1. A method of forming a transparent conductive oxide layer, the method comprising:

irradiating at least a portion of an amorphous transparent conductive oxide layer on a substrate with a laser beam to form one or more nucleation sites therein, wherein the irradiated amorphous transparent conductive oxide layer requires less thermal load to crystallize than the amorphous transparent conductive oxide layer.

2. The method of claim 1, further comprising:

annealing the irradiated amorphous transparent conductive oxide layer at a temperature of between about 400° C. and about 550° C. for between 10 minutes and 20 minutes.

3. The method of claim 1, further comprising:

annealing the irradiated amorphous transparent conductive oxide layer at a temperature of between about 550° C. and about 750° C. for less than 10 minutes.

4. The method of claim 1, wherein the transparent conductive oxide layer comprises crystalline cadmium stannate.

5. The method of claim 1, wherein the amorphous transparent conductive oxide layer comprises a material containing cadmium and tin.

6. The method of claim 5, wherein the amorphous transparent conductive oxide layer comprises a cadmium tin oxide.

7. The method of claim 1, wherein the laser irradiation is continuous and forms a nucleation layer within the amorphous transparent conductive oxide layer.

8. The method of claim 1, further comprising moving the substrate past a laser beam source, wherein the step of irradiating occurs in a laser irradiation pattern that is substantially perpendicular to a movement direction of the substrate.

9. The method of claim 8, wherein the laser irradiation pattern is linear.

10. The method of claim 8, wherein the laser irradiation pattern is an arrangement of spots.

11. The method of claim 8, wherein the laser irradiation pattern is an arrangement of lines.

* * * * *